US009753616B2

United States Patent
Hlatky et al.

(10) Patent No.: US 9,753,616 B2
(45) Date of Patent: Sep. 5, 2017

(54) METHOD, APPARATUS AND COMPUTER-READABLE STORAGE MEANS FOR ADJUSTING AT LEAST TWO PARAMETERS

(71) Applicant: NATIVE INSTRUMENTS GmbH, Berlin (DE)

(72) Inventors: Michael Hlatky, Berlin (DE); Dinos Vallianatos, Berlin (DE); Christian Wachsmuth, Berlin (DE)

(73) Assignee: Native Instruments GmbH, Berlin (DE)

( * ) Notice: Subject to any disclaimer, the term of this patent is extended or adjusted under 35 U.S.C. 154(b) by 0 days.

(21) Appl. No.: 14/339,961

(22) Filed: Jul. 24, 2014

(65) Prior Publication Data

US 2015/0029145 A1    Jan. 29, 2015

(30) Foreign Application Priority Data

Jul. 24, 2013 (EP) .................................... 13177851
Aug. 15, 2013 (EP) .................................... 13180601

(51) Int. Cl.
*G06F 3/0484* (2013.01)
*G06F 3/044* (2006.01)
(Continued)

(52) U.S. Cl.
CPC .......... *G06F 3/0484* (2013.01); *G06F 3/0362* (2013.01); *G06F 3/041* (2013.01);
(Continued)

(58) Field of Classification Search
CPC .... G06F 3/0362; G06F 3/03547; G06F 3/044; H04H 60/04; H04H 60/05
See application file for complete search history.

(56) References Cited

U.S. PATENT DOCUMENTS 5,678,539 A * 10/1997 Schubert ........... A61M 16/0051
128/204.21
5,719,570 A    2/1998 Breitbarth
(Continued)

OTHER PUBLICATIONS

Devine, "Undead instruments—timeFrog II—Inertial sensor gestures", Retrieved on Nov. 7, 2013, from http://vimeo.com/26930534#at=0 (video).
(Continued)

*Primary Examiner* — Patrick F Marinelli
(74) *Attorney, Agent, or Firm* — Fox Rothschild LLP; Robert J. Sacco; Carol E. Thorstad-Forsyth

(57) ABSTRACT

The present invention concerns a method, an apparatus and a computer-readable storage means for adjusting at least one parameter, which can be used for enhancing the user experience of adjusting parameters, especially of adjusting parameters in common audio software through a system of assignable rotary encoders with capacitive-sensing knob caps and a parameter type aware software. The invention especially enables a quick adjustment of several parameters by use of rotary encoders.

For this purpose, a method is proposed, where at least two touch sensitive input elements are provided for adjusting the at least two parameters, at least one of the at least two touch sensitive input elements is selected by contacting it with at least a first part of the human body, and the at least one parameter, which is assigned to the contacted touch sensitive input elements, is adjusted by operating, with at least a second part of the human body, at least one input element different from the contacted touch sensitive input elements.

20 Claims, 2 Drawing Sheets

(51) Int. Cl.

| | | |
|---|---|---|
| *G06F 3/041* | (2006.01) | |
| *G06F 3/0362* | (2013.01) | |
| *G10H 1/00* | (2006.01) | |
| *G10H 1/055* | (2006.01) | |
| *G10H 1/46* | (2006.01) | |
| *H03K 17/96* | (2006.01) | |
| *G06F 3/0488* | (2013.01) | |
| *G06F 3/0485* | (2013.01) | |
| *H04H 60/04* | (2008.01) | |

(52) U.S. Cl.
CPC ............ *G06F 3/044* (2013.01); *G06F 3/0485* (2013.01); *G06F 3/0488* (2013.01); *G06F 3/04847* (2013.01); *G10H 1/0091* (2013.01); *G10H 1/0551* (2013.01); *G10H 1/46* (2013.01); *H04H 60/04* (2013.01); *G10H 2220/096* (2013.01); *G10H 2230/015* (2013.01); *H03K 17/962* (2013.01)

(56) References Cited

U.S. PATENT DOCUMENTS

| | | | | |
|---|---|---|---|---|
| 5,757,941 | A * | 5/1998 | McMillen | H04H 60/04 381/119 |
| 5,880,718 | A * | 3/1999 | Frindle | H03K 17/962 341/33 |
| 5,959,610 | A * | 9/1999 | Silfvast | H01H 19/00 345/156 |
| 6,094,491 | A * | 7/2000 | Frindle | H03K 17/962 381/119 |
| 6,131,047 | A * | 10/2000 | Hayes, Jr. | G06F 3/0236 345/173 |
| 6,642,919 | B1 * | 11/2003 | Jaeger | G06F 1/1601 345/1.2 |
| 6,728,382 | B1 * | 4/2004 | Silfvast | H04H 60/04 381/119 |
| 6,813,530 | B1 | 11/2004 | Ives et al. | |
| 7,469,381 | B2 | 12/2008 | Ording | |
| 7,640,454 | B1 | 12/2009 | Botes | |
| 7,664,849 | B1 | 2/2010 | Chandler et al. | |
| 7,864,503 | B2 | 1/2011 | Chang | |
| 7,936,889 | B2 * | 5/2011 | Aiso | H04H 60/04 369/4 |
| 8,014,543 | B2 * | 9/2011 | Hirano | H04H 60/04 381/119 |
| 8,253,004 | B2 * | 8/2012 | Homburg | G10H 1/20 84/609 |
| 8,269,718 | B2 * | 9/2012 | Iwamura | G06F 3/0362 345/156 |
| 8,325,945 | B2 * | 12/2012 | Fujita | H04H 60/04 381/104 |
| 8,369,974 | B2 * | 2/2013 | Daisy | G06F 3/0488 700/94 |
| 8,381,103 | B2 * | 2/2013 | Terada | G06F 9/4446 715/705 |
| 9,063,644 | B2 * | 6/2015 | Zeng | G06F 3/04847 |
| 9,076,264 | B1 | 7/2015 | Gillespie et al. | |
| 9,205,914 | B1 * | 12/2015 | Fagan | B64C 19/00 |
| 9,310,901 | B2 * | 4/2016 | Wussler | G06F 3/0362 |
| 9,547,414 | B2 * | 1/2017 | Klepper | G06F 3/04847 |
| 2003/0152241 | A1 | 8/2003 | Eastty et al. | |
| 2005/0090913 | A1 * | 4/2005 | Terada | H04H 60/04 700/83 |
| 2005/0177287 | A1 * | 8/2005 | Wang | B60K 37/06 701/36 |
| 2006/0144397 | A1 * | 7/2006 | Wallace | A61M 16/0051 128/204.21 |
| 2006/0187216 | A1 * | 8/2006 | Trent, Jr. | G06F 3/03547 345/173 |
| 2006/0195801 | A1 * | 8/2006 | Iwamura | G06F 3/0362 715/864 |
| 2006/0256090 | A1 * | 11/2006 | Huppi | A63F 13/02 345/173 |
| 2006/0282562 | A1 * | 12/2006 | Aiso | H04H 60/04 710/33 |
| 2007/0057922 | A1 * | 3/2007 | Schultz | G06F 3/03547 345/173 |
| 2007/0085841 | A1 | 4/2007 | Tsuk et al. | |
| 2007/0209002 | A1 * | 9/2007 | Terada | G06F 9/4446 715/705 |
| 2008/0046098 | A1 * | 2/2008 | Corbin | G10H 1/0091 700/1 |
| 2008/0165141 | A1 * | 7/2008 | Christie | G06F 3/044 345/173 |
| 2008/0180393 | A1 * | 7/2008 | Iwamura | G06F 3/0362 345/156 |
| 2008/0295032 | A1 * | 11/2008 | Gioscia | G06F 3/0338 715/840 |
| 2008/0315798 | A1 * | 12/2008 | Diederiks | H05B 33/0863 315/312 |
| 2009/0009491 | A1 | 1/2009 | Grivna | |
| 2009/0166100 | A1 | 7/2009 | Matsubara | |
| 2009/0234479 | A1 * | 9/2009 | Shimizu | H04H 60/04 700/94 |
| 2009/0304207 | A1 | 12/2009 | Cooper | |
| 2010/0214257 | A1 * | 8/2010 | Wussler | G06F 3/0362 345/174 |
| 2010/0302168 | A1 * | 12/2010 | Giancarlo | G06F 1/1662 345/169 |
| 2010/0318204 | A1 * | 12/2010 | Daisy | G06F 3/0488 700/94 |
| 2011/0019841 | A1 * | 1/2011 | Fujita | H04H 60/04 381/119 |
| 2011/0029865 | A1 * | 2/2011 | Gilland | G06F 19/3406 715/702 |
| 2011/0041095 | A1 * | 2/2011 | Reed | G06F 3/0481 715/834 |
| 2011/0063230 | A1 * | 3/2011 | Mazur | G10H 1/0091 345/173 |
| 2011/0085682 | A1 * | 4/2011 | Park | G06F 3/0488 381/119 |
| 2011/0100198 | A1 * | 5/2011 | Gatzsche | G10H 1/0008 84/615 |
| 2011/0130200 | A1 | 6/2011 | Terada | |
| 2011/0240455 | A1 | 10/2011 | Kulczycki et al. | |
| 2011/0273316 | A1 | 11/2011 | Chabot | |
| 2012/0026090 | A1 | 2/2012 | Zielke et al. | |
| 2012/0237038 | A1 * | 9/2012 | Hagiwara | H04H 60/04 381/17 |
| 2013/0087037 | A1 * | 4/2013 | Dreher | G10H 1/0066 84/645 |
| 2013/0249814 | A1 * | 9/2013 | Zeng | G06F 3/04847 345/173 |
| 2014/0191979 | A1 | 7/2014 | Tsudik | |
| 2014/0214189 | A1 * | 7/2014 | Goodwin | H04H 60/04 700/94 |
| 2014/0221832 | A1 * | 8/2014 | El-Zehiry | A61B 8/54 600/437 |
| 2014/0254834 | A1 * | 9/2014 | Umeo | H04R 5/04 381/119 |
| 2014/0258935 | A1 * | 9/2014 | Nishida | G06F 3/038 715/833 |
| 2014/0266569 | A1 * | 9/2014 | Yoshikawa | G06F 3/165 340/4.4 |
| 2015/0002487 | A1 * | 1/2015 | Miles | G06F 3/0312 345/184 |
| 2015/0026613 | A1 | 1/2015 | Kwon et al. | |
| 2015/0029115 | A1 * | 1/2015 | Hlatky | G06F 3/041 345/173 |
| 2015/0029145 | A1 * | 1/2015 | Hlatky | G06F 3/041 345/174 |
| 2015/0062014 | A1 * | 3/2015 | Ludwig | G06F 3/0346 345/163 |
| 2015/0078584 | A1 * | 3/2015 | Moon | G10H 1/46 381/104 |
| 2015/0261372 | A1 * | 9/2015 | McMillen | G10H 1/02 345/174 |

(56) References Cited

U.S. PATENT DOCUMENTS

2016/0139788 A1* 5/2016 Nishikori .............. G11B 27/34
715/716

OTHER PUBLICATIONS

Native Instruments GMBH, "Traktor kontrol S4 manual", Retrieved on Nov. 6, 2013, from http://www.ferrispark.com/audio/Traktor%20Kontrol%20S4%20Manual%20English.pdf (233 pages).

Ui, "timeFrog @ interferenceCulturelle xtr3", Retrieved on Nov. 11, 2013, from http://www.youtube.com/watch?v=DQk6oPvFeMY (video).

Undead Instruments, "TimeFrog vII—User manual v1.3, firmware 1.26", Retrieved on Nov. 7, 2013, from http://www,undeadinst.com/products/timefrog/manuels/manuel-dutilisation-1.3 (16 pages).

* cited by examiner

METHOD, APPARATUS AND COMPUTER-READABLE STORAGE MEANS FOR ADJUSTING AT LEAST TWO PARAMETERS

CROSS REFERENCE TO RELATED APPLICATIONS

This application claims priority to European Application No. 13177851.6, filed Jul. 24, 2013, and titled "Method, Arrangement, Computer Program and Computer-Readable Storage Means for Controlling at least one Parameter or at least one Object Using Capacity Sensing Input Elements," the entirety of which is incorporated by reference. This application also claims priority to European Application No. 13180601.0, filed Aug. 15, 2013, and titled "Method, Arrangement, Computer Program and Computer-Readable Storage Means for Controlling at least one Parameter Using Capacity Sensing Input Elements," the entirety of which is incorporated by reference.

FIELD OF INVENTION

The present invention concerns a method, an apparatus and a computer-readable storage means for adjusting at least one parameter, which can be used for enhancing the user experience of adjusting parameters, especially of adjusting parameters in common audio software through a system of assignable rotary encoders with capacitive-sensing knob caps and a parameter type aware software. The invention especially enables a quick adjustment of several parameters by use of rotary encoders.

BACKGROUND

Controlling Parameters in Audio Software

Most analogue audio equipment is built following the "one knob per job" idiom. This means that each adjustable setting option that influences the sound of the device is controllable using one dedicated hardware control. Hence this hardware control can be designed to enable optimal controllability regarding the "functioning" of the parameter, for instance:

The level of a channel of a mixing console is controlled by a linear fader, as its position is easily readable, and multiple adjacent channel's levels are controllable simultaneously, as the user can adjust multiple faders' positions using one finger per fader.

The cut-off frequency of an analogue synthesizer's filter is controlled by a dominantly sized potentiometer, as it is one of the most frequently adjusted and most influential parameter to the synthesizer's sound.

The octave selector of an analogue synthesizer's oscillator is built as a detented "chicken head" knob with as many discrete positions as the oscillator provides octave settings, as this knob type's setting is clearly readable and it is highly improbable to inadvertently misadjust the knob.

This variety of control elements and the resulting level of controllability is what often gives analogue audio equipment its distinctive feel and satisfies its user's hedonic desires. However, when simulating analogue audio equipment in software, those dedicated hardware controls often turn into mere parameters, only represented by an illustration displayed on the computer screen, resulting in a loss of affective qualities and reduced level of controllability.

In most common audio software there are two ways to manipulate a parameter's value: It can be adjusted either directly, using the computer mouse or a touch screen to manipulate the parameter's on-screen visual representation, or remotely by using controls on an additional hardware controller.

In most cases, such an additional hardware controller is generic and therefore configurable to work with most common audio software by utilizing standardized communication protocols (e.g. MIDI), whereby the user is usually free to assign the hardware's controls to the parameters offered by the software. This means that one control on the hardware may represent different software parameters, depending on the current mapping.

The following generic control types, usually to be found on standard audio software controller hardware are generally provisioned for controlling software parameters:

Rotary potentiometers with a left and right limit, occasionally with an additional zero detent Rotary endless encoders Stepped rotary endless encoders Linear potentiometers The generic hardware controllers are further also mostly agnostic of their currently assigned parameter's functioning. This often results in that users encounter "disconnect" situations, where a hardware control is mapped to a software parameter in such a way that the hardware control does not at all represent the controlled parameter's functioning. Situations like this are for instance:

A parameter with a limited value range is mapped to an endless rotary encoder.

A parameter with a continuous value range is mapped to a stepped encoder.

A parameter with a number of discrete values is mapped to a non-stepped encoder.

In all these cases, the controllability of the parameter through the user is reduced in comparison to the appropriate "parameter functioning-control type" pairing. The parameter value might not be adjustable as precisely or quickly, and the generic control might further not emanate the impact of its associated parameter towards the sound.

In another special case of using common audio software, the controls on current hardware controllers may not only be mapped to adjust an audio signal processor's parameter value, but also for other control tasks such as list selection, for instance to select a parameter preset for a virtual instrument, or the next song to play in a DJ software. Most current controllers provide stepped encoders for this use case, as the user is provided with a distinct tactile feedback for each incremental change in the selection.

However, navigating long lists can become very cumbersome and time-consuming using this method, as the number of steps on most rotary encoders is small compared to the number of list entries commonly found in these use cases. Navigating for instance through a list of only 1000 songs using a 24-step encoder, the user may have to turn the encoder for multiple full revolutions until the desired list entry is found. Some software tries to counteract against this problem by introducing behaviours similar to the mouse acceleration functionality, namely that the selection offset per encoder increment is amplified depending on the turning speed of the encoder. This method, however, leads to a disconnect between the haptic feedback provided by the encoder increments and the selection progress.

On current touch screen computers, the problem of navigating long lists that display only a small subset of their items is mainly solved by modelling the list's motional behaviour by using an inertia simulation. A user can introduce movement to the list by swiping the list's displayed entries into the desired direction. When the to-selected entry becomes visible, the user can stop the list's movement by tapping down a finger onto the list's visual on-screen representation, then appoint the to-selected list entry by tapping into its corresponding screen real estate.

PRIOR ART

Control knobs with additional capacitive-sensing functionality for general purpose applications are known from the publications US 2009/0009491 A1 (Capacitive Sensing Control Knob) or US 2011/0240455 A1 (Control Knob). Large format mixing consoles and control surfaces for digital audio workstation software are usually equipped with touch-sensing faders (U.S. Pat. No. 5,880,718 A: Capacitive Touch Detection, U.S. Pat. No. 5,719,570 A: Optical encoder based fader design, US 2009/0304207 A1: Sound Mixing Console). In this use case, the touch sensing is used for either channel selection (i.e. the channel whose respective fader was last touched is focussed and usually all its parameters are mapped to be directly accessible by other controls on the mixing desk's surface), or for parameter automation overriding (i.e. a motorized fader stops following a parameter's value once the user touched it). Similarly, mixing consoles have also been equipped with a touch sensing joystick for surround panning applications (U.S. Pat. No. 6,813,530 B1: Audio Console with Motorized Joystick Panning System). A solution for navigating in long lists is known from U.S. Pat. No. 7,469,381 B2 (List Scrolling and Document Translation, Scaling, and Rotation on a Touch-Screen Display).

SUMMARY

It is therefore an object of the invention to provide a method, an apparatus and a computer-readable storage means for adjusting at least one parameter, which obviate the disadvantages of the prior art solutions and, more particularly, enable a user to adjust quickly several parameters simultaneously.

According to a first aspect of the present invention a method is provided for (simultaneously) adjusting at least one parameter by use of at least one touch sensitive input element. Each of the touch sensitive input elements has assigned a respective parameter to be controlled. The parameters may be freely assignable to an input element for using one input element for controlling different parameters at different times. This is useful, since by that a(n) (additional) hardware controller with a number of touch sensitive input elements can be used for control of different software applications, as for example audio software. According to the inventive method, at least one touch sensitive input element is provided for adjusting the parameter(s). Each of the touch sensitive input elements has assigned one parameter to be controlled. For (simultaneously) controlling at least one parameter out of the at least one parameter, a user of the input elements selects at least one touch sensitive input element by contacting the at least one touch sensitive input element with at least a first part of his body. Preferably the first part is a part of his left hand, especially a part of the fingers of his left hand. For adjusting the parameter(s), which is (are) assigned to the selected touch sensitive input element(s), the user operates at least one input element, which is different from the selected at least one sensitive input element, with at least a second part of his body.

Preferably the at least a second part of his body is a part of his right hand, especially a part of the fingers of his right hand.

Left and right hand are only examples for the first and second part of the human body. The described example especially illustrates use of the input elements by a right-handed person. A left-handed person would probably use the right hand for selecting and the left hand for adjusting. Further, other parts of the human body may used for selecting and adjusting. For example, according to a preferred embodiment, adjusting selected parameters, especially setting selected parameters to a pre-defined value, may be achieved by operating the input element by a foot. Thus, the input elements may comprise at least one pedal.

A particular advantage of the present invention consists in that several parameters can be simultaneously adjusted by operating the at least one input element, which is different from the selected at least one sensitive input element, if more than one touch sensitive input elements are provided and selected.

According to a preferred embodiment, at least a part of the at least one input element, which is different from the selected at least one sensitive input element, also has assigned a parameter. This parameter is adjusted, if the input element, which is different from the selected input element(s), is operated. According to a preferred embodiment, the parameter is adjusted irrespective of whether another touch sensitive input element is selected or not. According to an alternative embodiment, the parameter of the input element, which is different from the selected input element(s), is not adjusted by an operation of the input element, which is different from the selected input element(s), if another touch sensitive input element is selected.

According to yet a preferred embodiment, the input element, which is different from the selected input element(s), is only used for adjustment of parameters, which are assigned to the other input elements. According to this embodiment, the input element, which is different from the selected input element(s), has not assigned a parameter.

Thus, a number of input elements are provided, which comprises touch sensitive input elements. According to a preferred embodiment, all of the input elements are touch sensitive input elements; according to an alternative embodiment, a part of the input elements is realized as non-sensitive input elements. The number of input elements may be between 2 and 25, preferably between 5 and 15, particularly preferably between 8 and 12, where a number of 2 to 20, preferably of 5 to 15, particularly preferably of 8 to 10 may be realized as touch sensitive input elements. Preferable, at least a part, but preferably all, of the touch sensitive input elements are capacity sensing input elements. According to a preferred embodiment, the input element, which is operated by the at least one second part of the human body, is also a touch sensitive input element. According to an alternative embodiment, the input element, which is operated by the at least one second part of the human body, is a non sensitive input element.

According to a preferred embodiment, each of the input elements may be used as the operated input element for adjusting the at least two parameters. Especially, at least a part of the touch sensing input elements (preferably all) may be used as well as a selected input element and as an operated input element.

According to a preferred embodiment, the input elements (also referred to as encoder), especially the touch sensitive input elements are usable in two operating modes. In a first operating mode, the input element is usable for adjusting the parameter, which is assigned to the input element, by conventional operation, i.e. adjusting the parameter by rotating a rotary encoder with two fingers. In the second operating mode, the input element is not operated but only touched by the user. The input element is selected thereby. As mentioned above, the selected input element is not operated, but the parameter, which is assigned to the selected input element, is adjusted according to an operation of another input element, which will be described later.

According to a preferred embodiment, the operating mode is determined based on the capacity sensed by the capacity touch sensitive input element. Preferably, a threshold value is defined for the sensed capacity. If the sensed capacity value is equal to the threshold value or exceeds the threshold value, it is assumed that the touch sensitive input element is contacted by at least two fingers and conventional operation is performed according to the first operating mode. If the sensed capacity value is lower than the defined threshold, it is assumed that the touch sensitive input element is contacted only by one finger, thus selection of the input element is determined, and the second operating mode is performed, where the value, which is assigned to the selected input element is adjusted according to an operation of a third input element. According to another preferred embodiment, the surface of the (capacity) touch sensitive input element is subdivided into (capacity) sensing parts and non (capacity) sensing parts, where the non (capacity) sensing parts are arranged in such a way that the non (capacity) sensing parts are contacted by the part of the human body (for example fingers), when the input element is used in conventional way. For example, for a rotary encoder, only the cap may be realized as (capacity) sensing region, but the lateral surface may be realized as non (capacity) sensing area. Similar for a slide control: the surface, which is contacted by conventional use (i.e. sliding), may be realized as non (capacity) sensing area, while the cap, which is normally not contacted by conventional use, may be realized as (capacity) sensing region. According to an alternative embodiment, the surface of the input elements is subdivided into at least two different (capacity) sensing areas. Preferably, the capacity of each area is measured separately. With the help of the at least two different areas, at least two different situations can be detected. For example, a first (capacity) sensing area may be provided at a part of the input element, where the input element is contacted when it is used in conventional way (for example, a rotary input element may have a first sensing area at the lateral surface). A second (capacity) sensing area may be provided at a part of the input element, where it is usually not contacted, thereby indicating the second operative mode, when contacted. A rotary input element may have a second sensing area at the cap. According to yet another preferred embodiment, the first or second mode is activated with the help of a mode switch.

According to a preferred embodiment, for adjusting selected parameters, a user selects a number, for example one to five, of touch sensitive input elements. Each of the selected input elements has assigned a parameter to be adjusted. Preferably, the user contacts each of the selected touch sensitive input elements with a finger (of one of his hands). If the input elements, which have assigned the parameters to be adjusted, are selected, the user operates (only) one other input element for adjusting the selected parameters. Preferably the user operates the other input element with the fingers of the other hand. According the present invention, the selected input elements are not operated, i.e. not rotated, not shifted or such, for adjusting the corresponding parameters.

According to a preferred embodiment, the parameters, which are assigned to the selected input elements, are of the same kind, for example the level of different channels of a mixing console. Preferably, also the parameter of the operated input element is of the same kind as the parameters of the selected input elements.

As a result of the operation, the parameters, which are assigned to the selected input elements, are adjusted depending on the change of the parameter, which is assigned to the other operated input element, where the change is caused by the operation of the input element. According to a preferred embodiment, the change of the parameters, which are assigned to the selected input elements, is proportional to the change of the parameter assigned to the operated input element. According to another preferred embodiment, the parameter offset caused by the operation of the other input element is added to the parameters of the selected input elements. According to yet another preferred embodiment, the parameters, which are assigned to the selected input elements, are reset to a previous value or are set to a pre-defined value, for example a default value. For resetting, the (last) parameter value of an input element is stored in storage means of the controller after it is detected (for example, by evaluating values of sensed capacity) that the user has released the input element.

According to a preferred embodiment, at least a part of the input elements, preferably all input elements, is selected as long as the respective input element is contacted by the at least one first part of the human body. According to an alternative embodiment, an input element is selected by a first contact and de-selected by a (subsequent) second contact with the at least one first part of the human body. Especially, the input element is selected or de-selected if the duration of the first or second contact is below a predefined threshold. During selection, the parameter of the selected input element is adjustable via an other, operated input element.

A particular advantage comes into effect, when the inventive method is used for working with a control device having touch sensitive, mechanical input elements, such as rotatable, shiftable, pressable input elements.

An apparatus according to the invention comprises at least two touch sensitive input elements and at least one data processing unit and is configured for executing a method for adjusting at least one parameter, where the method comprises the following steps:

providing at least one touch sensitive input element for adjusting the at least one parameter;

selecting at least one of the at least one touch sensitive input elements by contacting the at least one input element with at least a first part of the human body; and adjusting the at least one parameter, which is assigned to the selected at least one touch sensitive input element, by operating, with at least a second part of the human body, at least one input element different from the selected at least one touch sensitive input element.

According to another aspect of the invention a computer program is provided, which after being loaded into the memory of a data processing unit, enables the data processing unit, which is communicatively connected with at least two input elements, to execute a method for adjusting at least one parameter, where at least one touch sensitive input element is provided for adjusting the at least one parameters, at least one of the at least one touch sensitive input elements is selected by contacting it with at least a first part of the human body, and the at least one parameter, which are assigned to the selected touch sensitive input element(s), is adjusted by operating, with at least a second part of the human body, at least one input element different from the selected touch sensitive input elements.

Such computer programs can be provided, for example, (fee-based or free of charge, freely accessible or password-protected) for downloading in a data or communication network. The provided computer programs can be used with a method, wherein the computer program is downloaded from an electronic data network, for example from the Internet, to a data processing system connected to the data network.

To perform the method of the invention for managing data, a computer-readable storage medium can be employed, on which program code is stored which, after being loaded into the memory of a data processing unit, enables the data processing unit, which is communicatively connected with at least two input elements, to execute a method for adjusting at least one parameter, where at least one touch sensitive input element is provided for adjusting the at least one parameters, at least one of the at least one touch sensitive input elements is selected by contacting it with at least a first part of the human body, and the at least one parameter, which are assigned to the selected touch sensitive input element(s), is adjusted by operating, with at least a second part of the human body, at least one input element different from the selected touch sensitive input elements.

Thus, the present invention prevents some of the shortcomings of the prior art solutions and provides an enhanced interaction with software through capacitive sensing knob caps, which is especially useful for an interaction with audio software.

DETAILED DESCRIPTION

Figure 1:
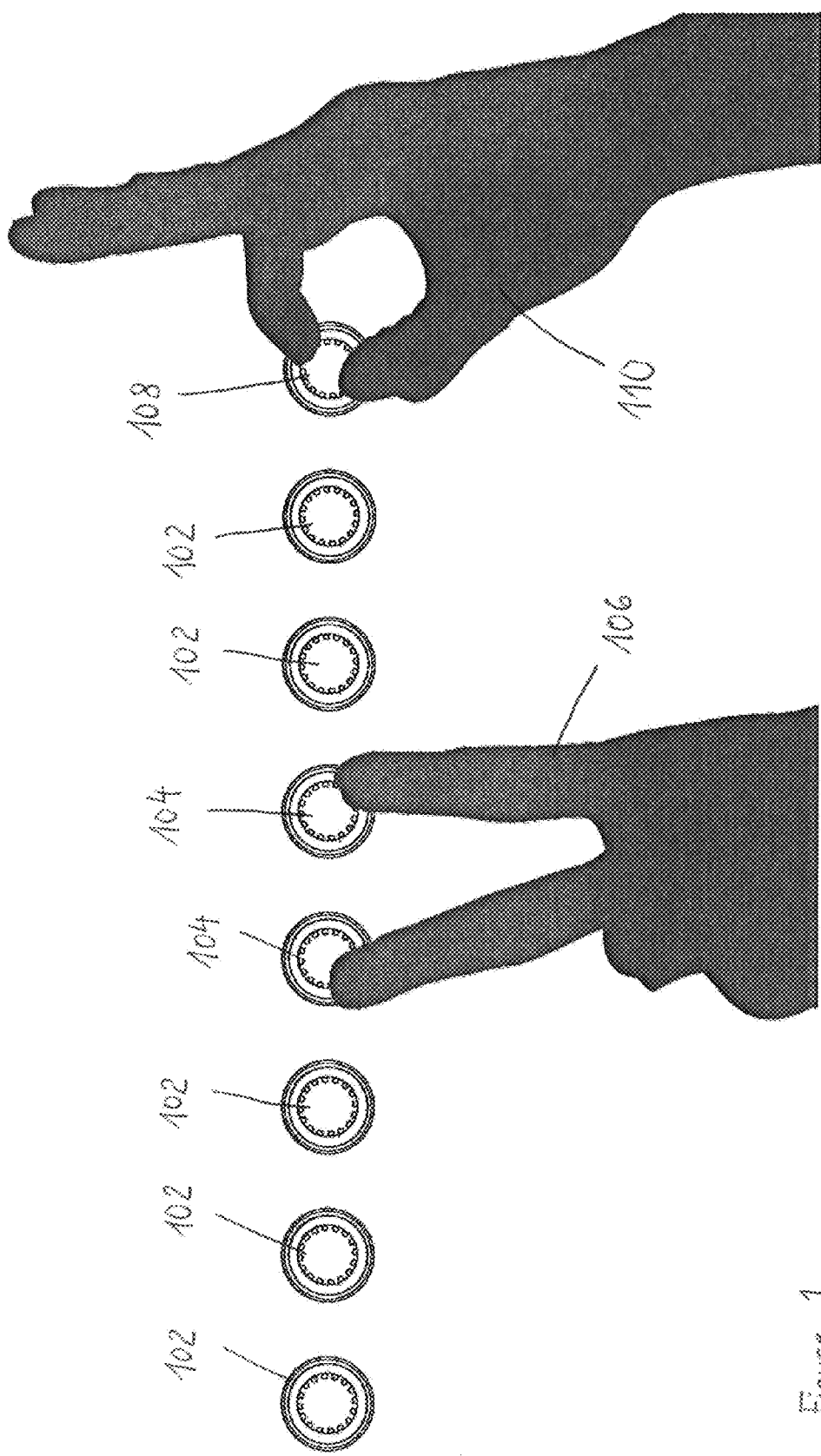
FIG. 1 shows a typical situation, where several (in this example two) parameters are adjusted with the help of one operated rotary control.

Exemplary embodiments of the invention will be described in more detail hereinafter with an example of a system consisting of a hardware controller with continuous endless stepped and non-stepped rotary encoders that are fitted with controller caps with capacitive sensing technology (Capacitive Sensing Control Caps), and a Parameter Type Aware Software.

In this system, the hardware controller provides the software with additional information on whether the encoder is touched by the user, and the software parameter is then set depending on the user's change to the control, the user's touch behaviour, and the parameter type. Depending on the current context, several ways to enhance the controllability of software parameters become possible.

Preferred Embodiment: Enabling Simultaneous Multiple Parameter Adjustment with Rotary Encoders Some hardware control types enable simultaneous control over parameters, as for instance in the case of setting multiple channel levels of a mixing console simultaneously by adjusting several adjacent faders using one finger on each fader. This bandwidth of controllability gets lost when the user is operating on rotary controls, as a rotary encoder requires one-handed (employing the thumb and index finger), not single-finger manipulation. With standard rotary controls, the user is therefore limited to adjusting a maximum of two parameters simultaneously, manipulating one control with the left and one with the right hand.

In a situation where not the controllability precision, but more the controllability speed is of interest to the user, (for instance if the user wants to quickly bring down the level of multiple channels on a software mixing console using rotary encoders) the inventive Capacitive Sensing Control Caps 102, 104, 108 and the inventive Parameter Type Aware Software System can support the user to set more than two parameter values simultaneously. This is achieved by having the user select the to-adjusted parameters by touching their corresponding controls 104 with each a single finger of one hand 106, and manipulating only one rotary control 108 with the other hand 110. The parameter offset of that one control 108 that is manipulated is then used to also accordingly adjust all other parameters the user selected by touching their corresponding controls 104.

To precisely set the value for each of the affected parameters, the user might still need to readjust each corresponding control 104 individually in subsequent interaction steps, but in time-critical situations (for instance if an audio feedback is building up in a live music context) the user is provided with a means to quickly react and adjust multiple parameters simultaneously.

Figure 2:
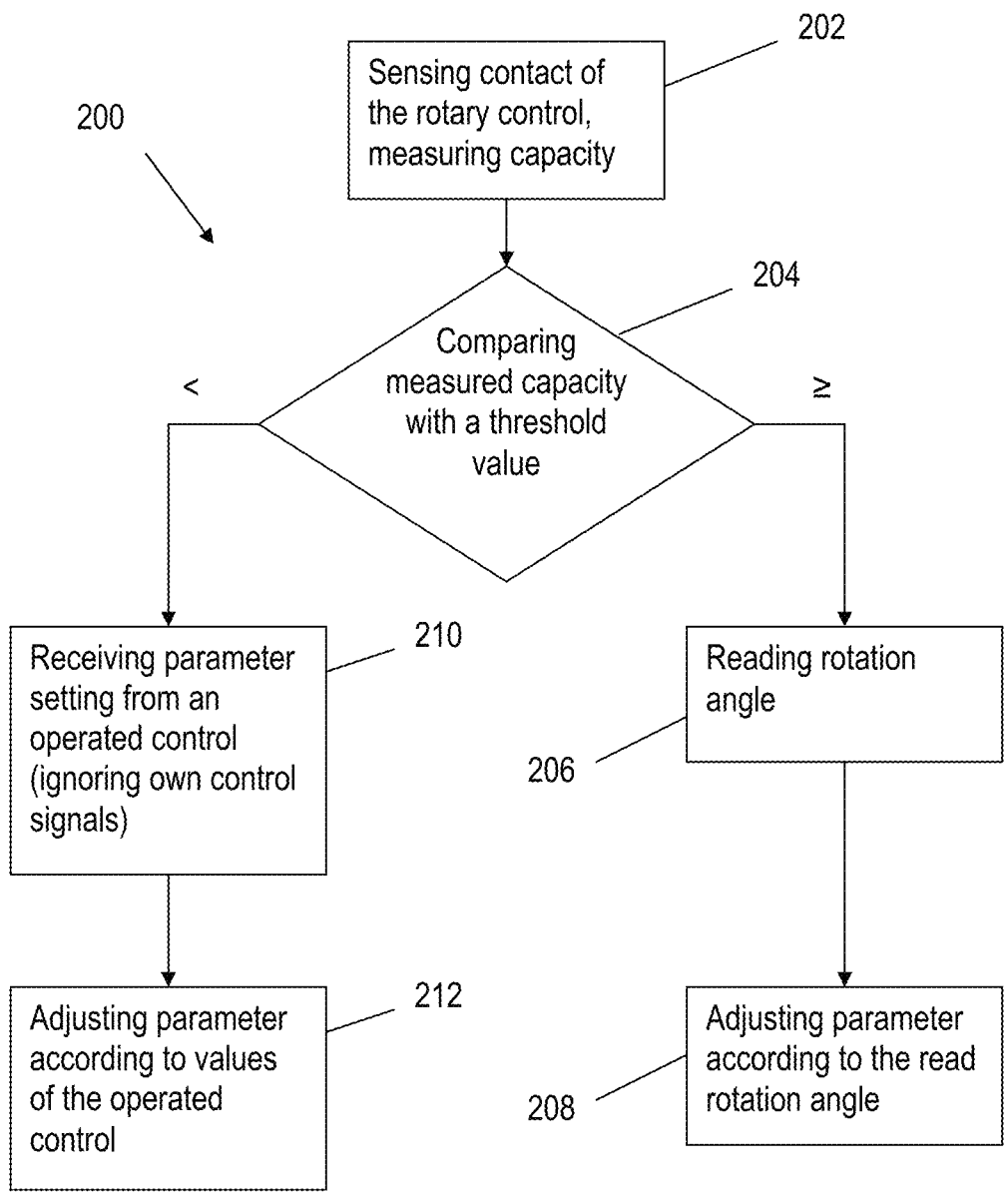
FIG. 2 shows a flow-chart of an exemplary method for adjusting at least two parameters.

An exemplary method for adjusting at least two parameters is now described with respect to the flow-chart 200 depicted in FIG. 2. In a first step 202, a rotary control 104, 108 is contacted by a user, and the Parameter Type Aware Software System senses the contact and measures a capacity value. In a subsequent step 204, the measured capacity value is compared with a pre-defined threshold value. If the comparison shows that the measured capacity value reaches or exceeds the threshold value, it is decided that the rotary control 108 is contacted by more than one finger which means that the rotary control 108 is operated for adjusting the parameter assigned to the contacted rotary control 108, and the process proceeds to step 206, where a rotation angle of the rotary control 108 is measured. In step 208, the parameter assigned to the contacted rotary control 108 is adjusted according to the measured rotation angle.

If in step 204 the comparison shows that the measured capacity value is lower that the threshold value, it is decided that the rotary control 104 is contacted by only one finger, which means that the rotary control 104 is selected for adjusting the parameter assigned to the contacted rotary control 104 according to control values of another operated control 108. Thus, the process proceeds to step 210, where the control value of the other control 108 is received. In step 212, the parameter assigned to the contacted rotary control 104 is set in dependence of the received control value. If in step 204 it is decided that the contacted rotary control 104 is a selected control 104, control signals, which are produced by this selected rotary control 104, are ignored and do not influence the parameter adjustment.

Simulating Inertial Behaviour

With the Capacitive Sensing Control Caps and Parameter Type Aware Software System, a user can navigate long lists quickly by means of a stepped encoder with a capacitive sensing knob cap: As long as the user is holding the knob, the selection is set according to the encoder's increments. A user can, however, spin the encoder quickly and subsequently release the encoder (similarly to the swiping gesture on a touch screen) by which movement is introduced to the list through an inertia simulation. When the to-selected list entry becomes visible, the user can stop the list's movement by touching the knob again, and then appoint the to-selected list entry by incrementally turning the knob accordingly.

Navigating long lists employing this technique becomes an easy task, as the selection precision is not declined: As long as the user touches the knob there is still a clear tactile feedback through the encoder's steps when the selection change is introduced. But by enabling the user to fast-forward the selected list position using an inertia simulation, the selection speed may be greatly enhanced.

The system would also further allow introducing a friction model, which simulates a friction to be overcome by moving the list or object. In this case, the user is provided with a friction feedback, when he starts operating the knob. The friction model can also be applied to the list or objects. In this case, instead of moving (endless) with constant speed, the list or object will move with decrease of the speed, and stop after a while.

The special embodiment described above can be combined advantageously with further functionality provided by the Capacitive Sensing Control Caps and Parameter Type Aware Software System.

Tap Gestures on the Control

When operating audio software, oftentimes a user has changed a parameter's value and wants to be able to quickly reset it to its default or last state, for instance to make quick A/B comparisons whether the introduced parameter change resulted in a favourable change in sound. Common audio software provides multiple ways to accomplish this, by for instance implementing the operating system's standard "undo" behaviour, or by providing A and B parameter sets which can be accessed via additional short cuts or buttons. Many of these ways, however, have in common that they might take the user's focus away from setting the parameter's value, hence possibly breaking the user's creative flow.

Employing the Capacitive Sensing Control Caps and Parameter Type Aware Software System, the system can check for a user's finger "taps" on the control's capacitive sensing knob caps by measuring the time delay between the touch and release events, and map different multi-tap gestures to different parameter manipulations. Multi-tap gestures are recognized by comparing the time difference between subsequent touch and release user actions to pre-defined time spans.

In a preferred configuration of the Capacitive Sensing Control Caps and Parameter Type Aware Software System, a double-tap gesture on the knob's cap is triggering the expected "undo" behaviour, namely setting the parameter value back to the state before the last atomic parameter adjustment, whereby an atomic adjustment is defined by setting the parameters value and then letting go the knob for more than a predefined time span. Additionally, a triple-tap gesture is triggering a "reset" behaviour, namely setting the parameter back to its initial value.

These behaviours enable a user to quickly set and reset parameter values without ever having to change the focus away from the current control, thereby enabling maximum concentration on the current task and providing little chance to breaking the user's creative flow.

The different tap gestures can also be mapped to different actions that don't affect the knob's associated parameter, as for instance switching other boolean parameters.

Simulating Control Detent Behaviour

There are a number of parameter types in audio software that require a control with one or more distinct tactile detents for precise and quick operation, such as for instance a parametric equalizer's filter amplitude parameter. This parameter type is commonly adjustable continuously over the range between −12 and +12 dB, yet the user needs to be able to quickly disable the filter, i.e. set the amplitude parameter's value to precisely 0 dB. Hence the control with required detent at the zero position for being able to rely on tactile feedback for this task.

If such a parameter is, however, mapped to a continuous endless rotary encoder without detent, the user can only quickly set the parameter to its extreme values by turning the control far enough into the appropriate direction (with the effect that once the parameter has reached its extreme value, any further turning of the control into that direction does not result in a further parameter change, the user has to rely on visual feedback). The user has, however, no way of setting the parameter quickly and precisely to the detent value. If the change is introduced quickly, the user will most probably overshoot or undershoot the value. Yet, if the user tries to set the value precisely, changes need to be introduced gradually while using only visual feedback to check the parameter's value, hence the process will require a considerable time.

To enable a user to quickly set the parameter to the detent value even with a continuous endless rotary encoder, the Capacitive Sensing Control Caps and Parameter Type Aware Software System allows the user to only set the parameter in between the range sections divided by the detent positions, namely −12 to 0 dB, and 0 dB to +12 dB in case of the filter amplitude parameter. The 0 dB "centre detent" therefore acts just like one of the extreme values, i.e. if the user hits the 0 dB value coming from the negative value spectrum, any further change of the control towards the positive value spectrum will result in no further value change.

In order to set the parameter beyond the detent to a value inside the other range section, the user first has to set the parameter to the value representing the detent, release and then touch the knob again, by which the parameter can be set freely in both sections. Once the user has set the parameter to a value in one of the adjacent range sections, the only way to leave that range section again is to set the parameter to the value representing the detent, release and touch the knob again, and then set the parameter to a value in the other range section.

By employing this technique, the user can quickly set the parameter value to the detent, just as quickly as to one of the extremes of the value spectrum. Setting the parameter between values that are on opposite sides of the detent (in the case of the filter amplitude parameter for instance from −3 dB to 3 dB) requires the user to perform two more steps, namely releasing and grabbing the knob again after the parameter reached its detent value.

As the user is, however, interacting with a rotary encoder, these two additional interaction steps might feel natural, even seemingly unnoticeable, as the most common way of adjusting a rotary encoder is to grab the encoder between the thumb and the index finger, twist the encoder cap between the two fingers until a certain rotary motion was achieved, then letting go of the encoder cap quickly and grab the encoder again in the original finger position. So, once the detent value is reached, the user just has to perform the natural interaction sequence of repositioning his fingers on the control and is then free to set the control's associated value beyond the detent.

The same virtual detent technique can be applied to parameter types that require more than one detent, or parameter types providing a number of discrete values, as for instance the previously mentioned octave selector controlling a synthesizer's oscillator with five discrete values (−2, −1, 0, +1, +2). Usually such parameters should be controlled using a stepped rotary encoder, where each step in turning the encoder would result in an incremental change to the parameters value, allowing the user to rely on tactile feedback for timely introducing the discrete value change. If such a parameter is mapped to an endless rotary encoder, the user has little control over when the value change occurs, as the user might not know how "far" the control needs to be turned to trigger the value change.

The capacitive sensing continuous endless rotary controls can, however, also be used to set the discrete values timely. Starting at an initial discrete value, the user can turn the encoder either left or right to reach the next two adjacent values. If the user wants to set the parameter to a value that is not adjacent to the initial value he needs to quickly release and grab the control cap again at each in between value. This interaction sequence only lends itself for parameters with a suitable, not too high count of discrete values, but it is still preferable to having to set the parameter's value with a continuous rotary encoder with no tactile feedback upon when, while turning the knob, the next discrete value change will be introduced.

Each of the previously described control modes can also be combined freely, so for instance a parameter's value could be changed defined by the system through an inertia simulation and the detent simulation, while tap gestures on the knob cap are mapped to the aforementioned reset behaviour. Furthermore, the current knob type and its behaviour could also be visualized using LED rings around the knob.

Embodiments of the invention are not limited to the afore-described preferred exemplary embodiments. Rather, a number of variations are feasible which make use of the method, the arrangement, the computer program or the computer-readable storage means of the invention even with fundamentally different implementations.

The invention claimed is:

1. A method for adjusting at least two parameters, the method comprising:
providing at least two touch sensitive input elements for adjusting the at least two parameters;
selecting the at least two touch sensitive input elements by contacting the at least two touch sensitive input elements with at least a first part of the human body; and
simultaneously adjusting the at least two parameters, which are assigned to the selected at least two touch sensitive input elements, by using at least a second part of the human body to manipulate at least one input element different from the selected at least two touch sensitive input elements;
wherein at least a part of the at least one input element also has assigned a parameter thereto; and
wherein the parameter assigned to the at least one input element is also adjusted when the at least one input element is manipulated during the simultaneous adjusting of the at least two parameters.

2. The method of claim 1, wherein the at least two touch sensitive input elements comprise at least one mechanically operatable input element.

3. The method of claim 2, wherein the at least one mechanically operatable input element comprise at least one of a rotatable, a shiftable, a pressable input element and a pedal.

4. The method of claim 1, wherein the at least one input element operated by the second part of the human body is a non-touch-sensitive input element.

5. The method of claim 1, wherein the input element operated by the second part of the human body is a touch sensitive input element.

6. The method of claim 1, wherein at least a part of the at least two touch sensitive input elements is realized as capacity sensing input element.

7. The method of claim 6, wherein it is determined whether an input element is selected by evaluating capacity values sensed by the input element.

8. The method of claim 1, wherein at least a part of the at least two parameters is adjusted proportional to a rate of change of a value set by the input element operated by the second part of the human body.

9. The method of claim 1, wherein at least a part of the at least two parameters is adjusted by setting it to a pre-defined value.

10. The method of claim 9, wherein the pre-defined value is a default value.

11. The method of claim 1, wherein at least a part of the at least two parameters is adjusted by setting it to a previous value.

12. The method of claim 1, wherein each of the at least two touch sensitive input elements is usable as an operated input element for adjusting the at least two parameters.

13. The method of claim 1, wherein one of the at least two touch sensitive inputs is selected as long as the one of the at least two touch sensitive input elements is contacted by the first part of the human body.

14. The method of claim 1, wherein one of the at least two touch sensitive inputs is selected by a first contact with the first part of the human body and is de-selected by a second contact with the first part of the human body.

15. The method of claim 1, wherein at least one of the first and second parts of the human body is a part of a hand.

16. The method of claim 15, wherein the first part of the human body is a part of the left hand and the second part of the human body is a part of the right hand, or reversely.

17. The method of claim 1, wherein at least one of the first and second parts of the human body is a part of a foot.

18. An apparatus, comprising at least two touch sensitive input elements and a data processing unit, the apparatus being configured for executing a method according to claim 1.

19. A non-transitory computer-readable storage medium, on which a program is stored, which enables a data processing system, after the program is loaded into a memory of the data processing system, to execute a method according to claim 1.

20. A computer-implemented method for adjusting a first parameter and a second parameter, the method comprising:
providing a first touch sensitive input element for adjusting the first parameter;
providing a second touch sensitive input element for adjusting the second parameter;
providing a third touch sensitive input element for adjusting a third parameter;
recognizing a first touch gesture made with at least one first part of a human body;
selecting the first touch sensitive input element and the second touch sensitive input element based at least in part on the first touch gesture;
recognizing a second touch gesture made with at least one second part of the human body, the at least one second part of the human body being different than the at least one first part of the human body; and operating the third touch sensitive input element based in least at part on the second touch gesture to simultaneously adjust the first, second, and third parameters.

* * * * *